United States Patent
Miwa

(10) Patent No.: US 6,791,401 B2
(45) Date of Patent: Sep. 14, 2004

(54) CONTINUOUS-TIME ANALOG FILTER HAVING CONTROLLABLE GAIN CHARACTERISTICS

(75) Inventor: Toshitsugu Miwa, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 1 day.

(21) Appl. No.: 10/265,664

(22) Filed: Oct. 8, 2002

(65) Prior Publication Data

US 2003/0067347 A1 Apr. 10, 2003

(30) Foreign Application Priority Data

Oct. 10, 2001 (JP) .......................................... 2001-312785

(51) Int. Cl.⁷ ................................................ H04B 1/10
(52) U.S. Cl. ...................... 327/556; 327/552; 330/303
(58) Field of Search ................................ 327/551, 552, 327/553, 554, 556, 557, 558, 559; 330/302, 303

(56) References Cited

U.S. PATENT DOCUMENTS

| 4,546,326 A | * | 10/1985 | Van Uffelen et al. ........ 330/129 |
| 4,829,593 A | * | 5/1989 | Hara ......................... 455/234.2 |
| 5,838,194 A | * | 11/1998 | Khoury ....................... 330/139 |
| 5,987,065 A | * | 11/1999 | Candage ...................... 375/232 |
| 6,011,435 A | * | 1/2000 | Takeyabu et al. ............ 330/252 |
| 2003/0151454 A1 | * | 8/2003 | Buchele ........................ 327/551 |

* cited by examiner

Primary Examiner—Terry D. Cunningham
(74) Attorney, Agent, or Firm—McDermott, Will & Emery

(57) ABSTRACT

A Gm-C filter includes a filter passing an intended signal SI# in an input signal SI, and a control signal producing portion detecting a peak voltage value of an output signal of a filter to be controlled and a peak voltage value of the intended signal SI#, and making a comparison between them to produce a gain control signal CS for controlling a gain, and corrects a gain loss in the filter by applying the gain control signal CS to the filter.

4 Claims, 13 Drawing Sheets

CONTINUOUS-TIME ANALOG FILTER HAVING CONTROLLABLE GAIN CHARACTERISTICS

BACKGROUND OF THE INVENTION

1. Field of the Invention

The present invention relates to a continuous-time filter, and particularly to a filter using an OTA (Operational Transconductance Amplifier) and a capacitor.

2. Description of the Background Art

Filters are one kind of circuits frequently used in electronic circuits. In some cases, however, a signal-to noise ratio of filter is detrimental by the noises generated by the filter itself so that the filter cannot be practically used. In recent years, a continuous-time filter has particularly received attention because it can be formed in an LSI structure, can operate fast and can effectively utilize properties of a continuous-time system. An OTA-C filter (also referred to as a "Gm-C" filter) using an OTA and a capacitor (C) is known as a typical example of the continuous-time filter. This filter will now be discussed as the "Gm-C filter".

The Gm-C filter uses OTAs (Operational Transconductance Amplifier), which is a kind of operational amplifiers, as basic cells, and achieves the filter properties by an integrating operation, in which a capacitor capacitance is charged with a current varying proportionally to an input voltage and thus having linear characteristics.

FIG. 14 shows a general circuit structure of a secondary band-pass Gm-C filter using the OTAs as basic cells.

A secondary band-pass Gm-C filter 10 includes OTAs 1–4 and capacitors CC1 and CC2.

OTAs 1–4 have conductances set to values of Gm1–Gm4, respectively.

FIG. 15 shows a circuit structure of one of OTAs 1–4 forming the Gm-C filter.

Referring to FIG. 15, each of OTAs 1–4 includes P-channel MOS transistors PT1 and PT2, and N-channel MOS transistors NT1–NT6.

P- and N-channel MOS transistors PT1 and NT1 are connected in series between a power supply voltage VCC and a node N0 via an output node OP. P- and N-channel MOS transistors PT1 and NT1 receive on their gates a control signal VCOM and a signal applied to an input node IN, respectively. P-channel MOS transistor PT2 and N-channel MOS transistor NT2 are connected in series between power supply voltage VCC and a node N1. P-channel MOS transistor PT2 and N-channel MOS transistor NT2 receive on their gates control signal VCOM and a signal applied to an input node IP, respectively. N-channel MOS transistors NT3 and NT4 are connected in parallel between nodes N0 and N1, and receive on their gates signals applied to input nodes IP and IN, respectively. N-channel MOS transistors NT5 and NT6 are connected between node N1 and a ground voltage GND and between node N0 and ground node GND, respectively, and both receive on its gate a bias signal VBIAS.

Each of OTAs 1–3 makes a comparison between the levels of signals applied to input nodes IN and IP, and outputs a current signal from output node OP in proportion to the level difference. A bias signal VBIAS and control signal VCOM are at analog bias levels during the operation, respectively.

Referring to FIG. 14 again, OTAs 1–3 are arranged in parallel, and each have an output connected to an output node N2. Capacitor CC2 is connected between output node N2 and ground voltage GND. A signal applied to output node N2 is output as an output signal SO of secondary band-pass Gm-C filter 10.

OTA 1 receives on its input nodes IP and IN a signal SI applied to secondary band-pass Gm-C filter 10 and reference voltage REF, respectively, and runs an output current to an output node OP electrically connected to output node N2. Note that the reference voltage REF is a prescribed voltage of the analog-bias level. OTA 2 receives on its input nodes IP and IN a signal applied from a node N3 and reference voltage REF, respectively, and runs an output current to output node OP electrically connected to node N2. OTA 4 receives on its input nodes IP and IN rcferebce voltage REF and a signal applied to node N2, respectively, and runs an output current to output node OP electrically connected to node N3. Capacitor CC1 is connected between ground voltage GND and node N3. OTA 3 receives on its input nodes IP and IN a signal applied from a node N2 and reference voltage REF, respectively, and runs an output current to output node OP electrically connected to node N2. Consequently, capacitor CC1 is charged by a current of Gm 4. Capacitor CC2 is charged by currents of Gm1, Gm2 and Gm3.

Second band-pass Gm-C filter 10 receives input signal SI, and passes an output signal SO having a frequency in a predetermined band.

In a design of the Gm-C filter, if it can be assumed that the OTA used as a basic cell has an infinite input impedance and an infinite output impedance, a Gm-C filter having ideal gain characteristics can be achieved.

In practice, although an input resistance of the OTA can be ignored in CMOS process, an output resistance is set to a finite value of up to several mega-ohms, and cannot be ignored. Therefore, a Gm-C filter exhibiting ideal gain characteristics may not be achieved.

Referring to FIG. 15 again, an output resistance Rda of the whole OTA depends on a resistance Rds1 between a source and a drain of P-channel MOS transistor PT1 on the output stage and a resistance Rds2 that can be viewed from a drain of N-channel MOS transistor NT1 on the output stage. Output resistance Rds1 of P-channel MOS transistor PT1 is represented by "Rdsp", and output resistance Rds2 on N-channel MOS transistor NT1 side is represented by "Rdsn×Rdsbri×gmd". Whole output resistance Rda is equivalent to a parallel connection of output resistances Rds1 and Rds2. Therefore, the resistance between output resistances Rds1 and Rds2 on the P- and N-channel sides which is smaller acts predominantly. Accordingly, output resistance Rda of the whole OTA can be discussed by focusing attention on either of output resistance Rds1 or Rds2. Rdsp, Rdsn, Rdsbri and gmd in the above description represent a source-drain resistance of P-channel MOS transistor PT1, a source-drain resistance of N-channel MOS transistor NT1, a bridge resistance of N-channel MOS transistors NT3 and NT4, and a mutual conductance of N-channel MOS transistor NT1, which is a differential transistor, respectively.

When P- and N-channel MOS transistors PT1 and NT1 operate in saturation, source-drain resistances Rdsp and Rdsn thereof (which will be generally referred to as source-drain resistances "Rds", hereinafter) are determined by the following formula:

$$Rds = \partial Vds / \partial Ids = \frac{1}{\lambda \cdot Ids} \quad (1)$$

where λ is an output impedance constant, Ids is a current between source and drain.

Thus, source-drain resistance Rds can be considered as a function of the parameters λ and Ids of transistor. Consequently, source-drain resistance Rds increases as the parameter λ of the transistor decreases. Also, source-drain resistance Rds decreases as the parameter λ of the transistor increases.

Accordingly, source-drain resistance Rds of the P- or N-channel MOS transistor varies as the parameter λ is dependant on the wafer process. Therefore, the Gm-C filter cannot perform an ideal integrating operation as a whole, and the gain characteristics disadvantageously vary.

To prevent variations of gain characteristics, it may be considered to employ a manner of tuning or controlling gain characteristics by improving source-drain resistance Rds and others, which primarily determine the value of the output impedance.

In a manufacturing step, however, it is difficult to tune or control the gain characteristics by improving various elements, as characteristic variation between conductances Gm1–Gm4 and variations occur in foregoing parameters Rdsp, Rdsn, Rdsbri, gmd and others in manufacturing stages.

SUMMARY OF THE INVENTION

An object of the invention is to provide a Gm-C filter, of which gain is controlled or tuned for precisely correcting a gain loss.

According to the invention, a continuous-time analog filter includes a first filter for amplifying a signal having a frequency within a certain band in an input signal with a predetermined amplification gain, and passing the amplified signal; and a gain control circuit for controlling the amplification gain in the first filter. The gain control circuit includes a second filter for amplifying the input signal with the predetermined amplification gain, and rejecting interference waves contained in the input signal, detecting circuits for detecting maximum values of amplitudes of output signals of the first and second filters, and a comparing and determining circuit for receiving results of detection of the detecting circuit, and controlling the amplification gain of the first filter based on a comparison between the output signals of the first and second filters.

According to the Gm-C filter of the invention, since the comparing and detecting circuit can control the amplification gain of the first filter, a gain loss in the first filter can be precisely corrected.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will now be described in greater detail with reference to the drawings. In the figures, the same or corresponding portions bear the same reference numbers, and description thereof is not repeated.

(First Embodiment)

Figure 1:
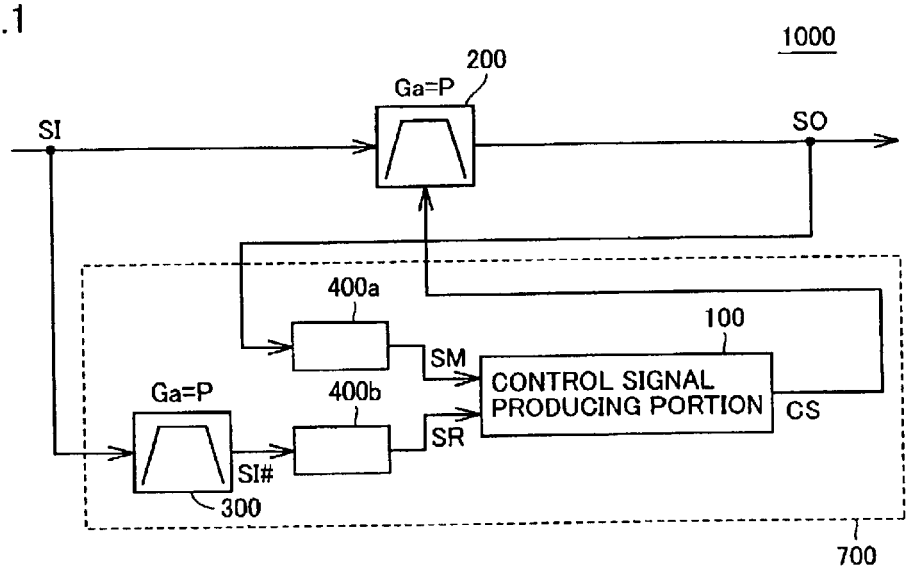
FIG. 1 shows circuit blocks in a Gm-C filter 1000 according to a first embodiment of the invention.
Figure 14:
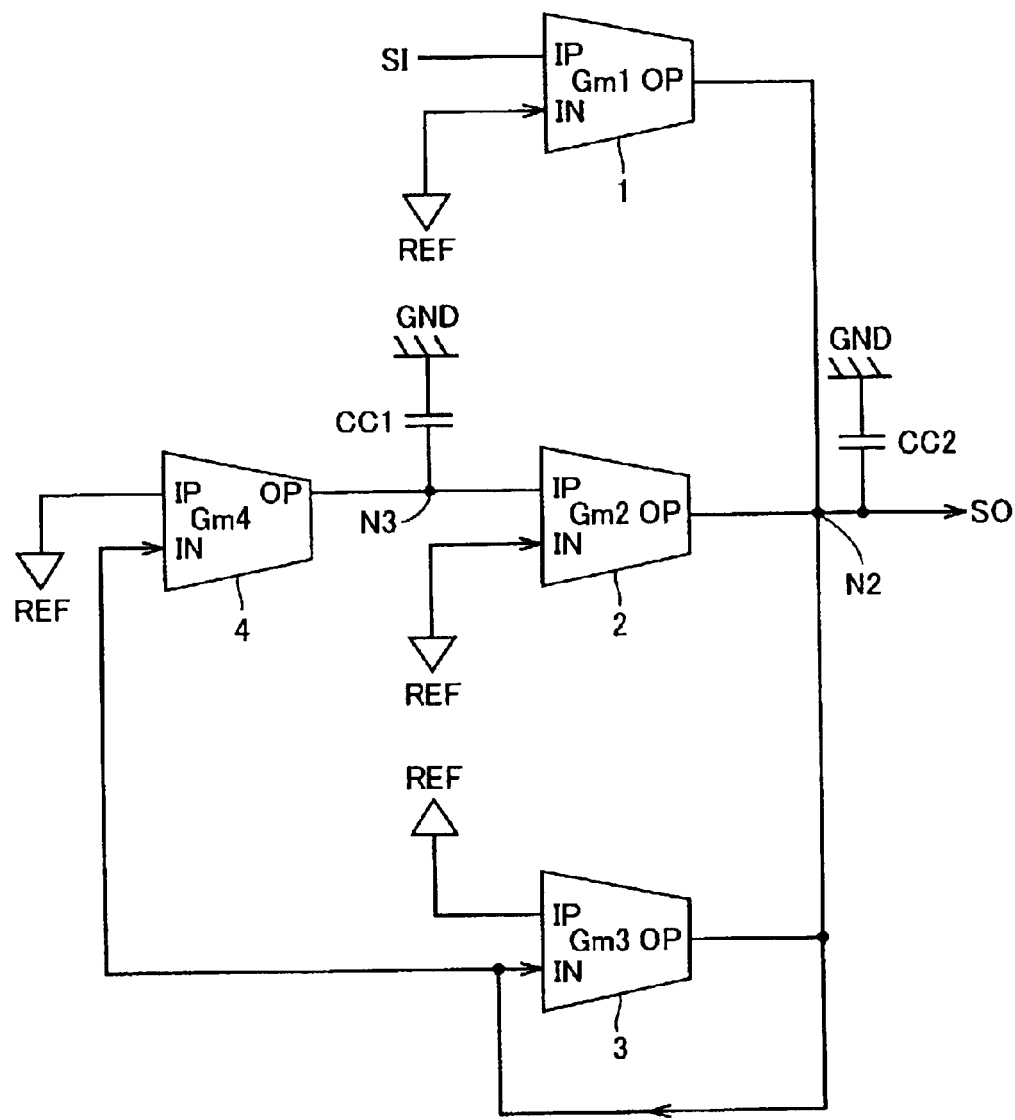
FIG. 14 shows a conventional circuit structure of a secondary band-pass Gm-C filter 10 using OTAs as basic cells.
Figure 15:
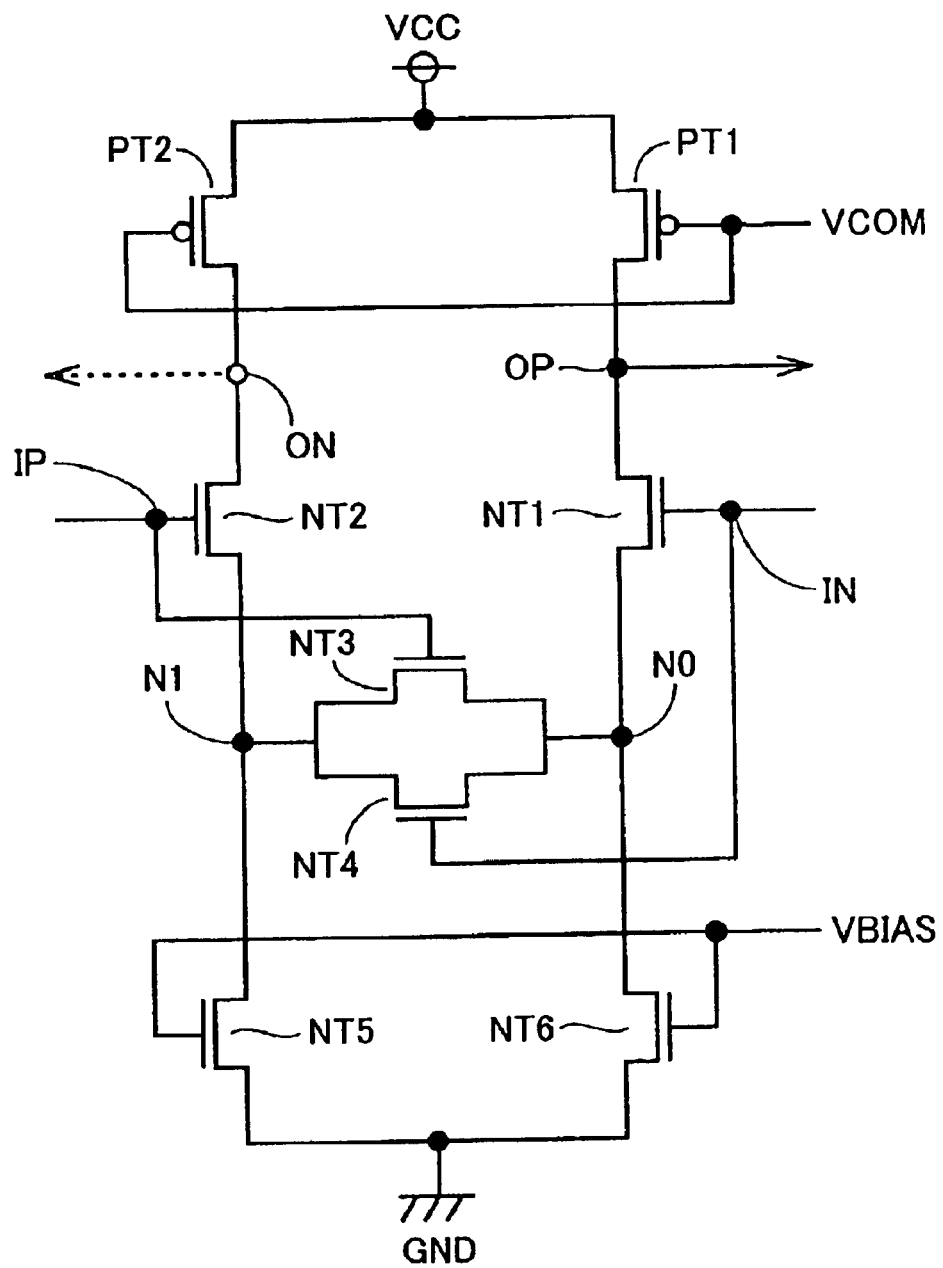
FIG. 15 shows a circuit structure of the OTA forming the Gm-C filter.

Referring to FIG. 1, a Gm-C filter 1000 includes a filter 200 and a gain control circuit 700. Filter 200 consists of at least one Gm-C filter 10, which has a gain Ga equal to P (Ga=P) according to ideal gain characteristics. Each of OTAs as well as circuit structures thereof are the same as those already described with reference to FIGS. 14 and 15, and therefore description thereof is not repeated.

Description will now be given on parameters determining the characteristics of secondary band-pass Gm-C filter 10.

A center frequency Fc as well as a quality factor Q and gain Ga of the filter are defined by the following formulas (2)–(4).

$$Fc = \frac{1}{\pi}\sqrt{(Gm2 \times Gm4)/(Ca \times Cb)} \quad (2)$$

$$Q\sqrt{((Gm2 \times Gm4)/Gm3 \times Gm3)) \times (Cb \times Ca)} \quad (3)$$

$$Ga = Gm1/Gm3 \quad (4)$$

where Gm1, Gm2, Gm3 and Gm4 represent conductances of OTAs forming the filter, respectively, and Ca and Cb represent integration capacitances of capacitors CC1 and CC2, respectively.

Accordingly, gain Ga is determined by a ratio between conductances of OTAs 1 and 3. According to the invention, conductance Gm1 of OTA 1 is tuned or controlled for the purpose of improving the gain characteristics of the filter.

Referring to FIG. 1, gain control circuit 700 includes a filter 300, which rejects interference waves contained in an input signal SI applied to filter 200, and outputs an intended signal SI#, a peak detector 400b, which samples a peak voltage of intended signal SI# applied from filter 300, and outputs a sampling signal SR, a peak detector 400a, which samples a peak voltage of output signal SO passed through filter 200, and outputs a sampling signal SM, and a control signal producing portion 100, which receives output signals SM and SR of respective peak detectors 400a and 400b, and produces a gain control signal CS, i.e., a signal for gain control.

Figure 2:
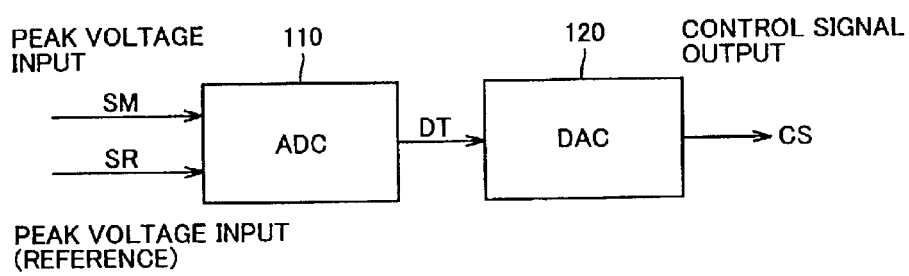
FIG. 2 is a block diagram showing a structure of a control signal producing portion 100.

Referring to FIG. 2, control signal producing portion 100 includes an A/D converter 110 and a D/A converter 120, which will be referred to as "ADC circuit" and "DAC circuit" hereinafter, respectively. ADC circuit 110 receives sampling signals SM and SR applied from peak detectors 400a and 400b, respectively, and converts a difference between them into a digital form to output a signal DT to DAC circuit 120. DAC circuit 120 receives digital input signal DT applied from ADC circuit 110, and outputs gain control signal CS to filter 200.

Figure 3:
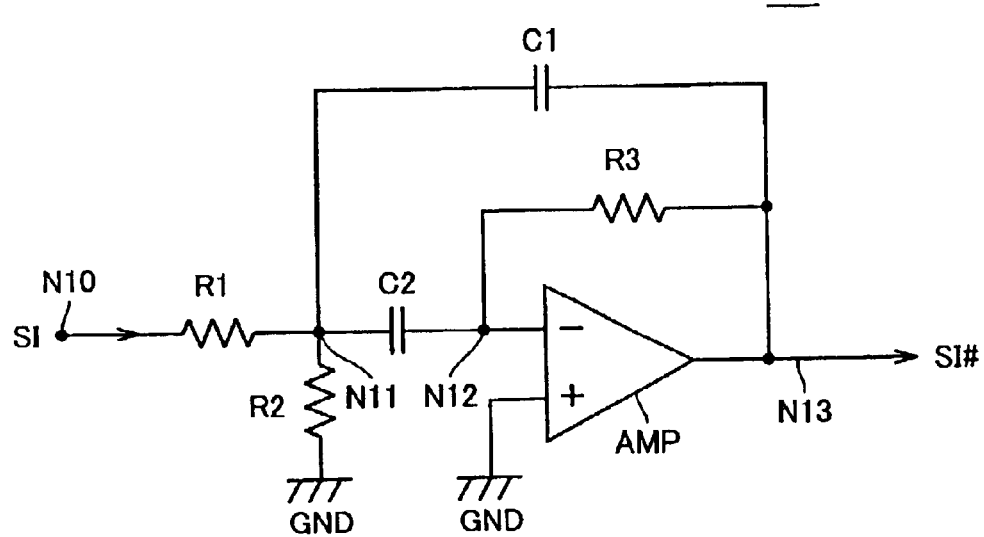
FIG. 3 shows, by way of example, circuit components of a filter 300.

FIG. 3 shows a circuit structure of filter 300.

Filter 300 includes resistances R1–R3 receiving input signal SI, capacitors C1 and C2, and an operational amplifier AMP.

Resistance R1 is connected between nodes R10 and N11, and resistance R2 is connected between node N11 and ground voltage GND. Capacitor C1 is connected between node N11 and an output node N13 outputting intended signal SI#. Capacitor C2 is connected between nodes N11 and N12. Resistance R3 is arranged in parallel with operational amplifier AMP, and is connected between a node N12 and an output node N13. One of input terminals of operational amplifier AMP is connected to node N12, and the other is connected to ground voltage GND. An output terminal of operational amplifier AMP is connected to output node N13. Filter 300 is a band-pass filter, and has a gain proportional to a resistance ratio of R3/R1.

Description will now be given on the operation of Gm-C filter 1000 of the first embodiment of the invention.

Referring to FIG. 1 again, input signal SI of the Gm-C filter according to the invention is input to filters 200 and 300. During an initial period for gain control, a gain loss occurs in output signal SO of filter 200. Filter 300 has a gain Ga equal to P (Ga=P), rejects interference waves mixed in input signal SI, and passes a signal component of intended signal SI# with gain Ga equal to P.

Peak detector 400b precisely samples a peak voltage value of intended signal SI# passed through filter 300. Peak detector 400a precisely samples a peak voltage value of output signal SO passed through filter 200.

Peak detectors 400a and 400b apply sampling signals SM and SR generated by the sampling to control signal producing portion 100, respectively.

Control signal producing portion 100 uses sampling signal SR as a reference level, and produces gain control signal CS, which matches a level of sampling signal SM with the reference level.

Figure 4:
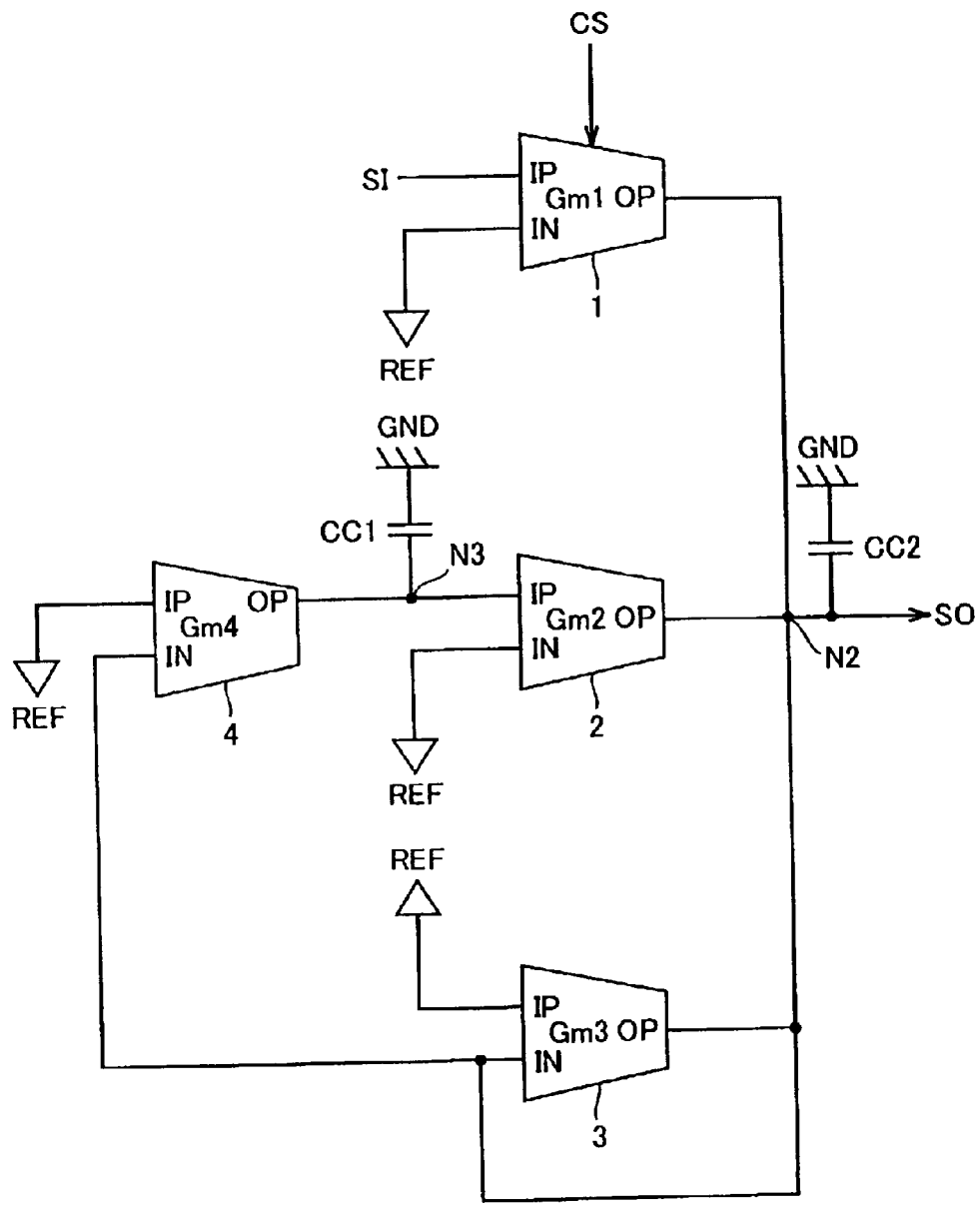
FIG. 4 shows a structure for inputting a gain control signal CS to an OTA 1 in a filter 200.

FIG. 4 shows a structure for inputting gain control signal CS to OTA 1 of filter 200.

As already described, gain Ga of the Gm-C filter according to the formula (4) is determined by the ratio between conductances Gm1 and Gm3, i.e., Gm1/Gm3. By applying gain control signal CS to a bias signal VBIAS of OTA 1, conductance Gm1 changes, and filter 200 is corrected to have gain Ga equal to P (Ga=P).

Figure 5:
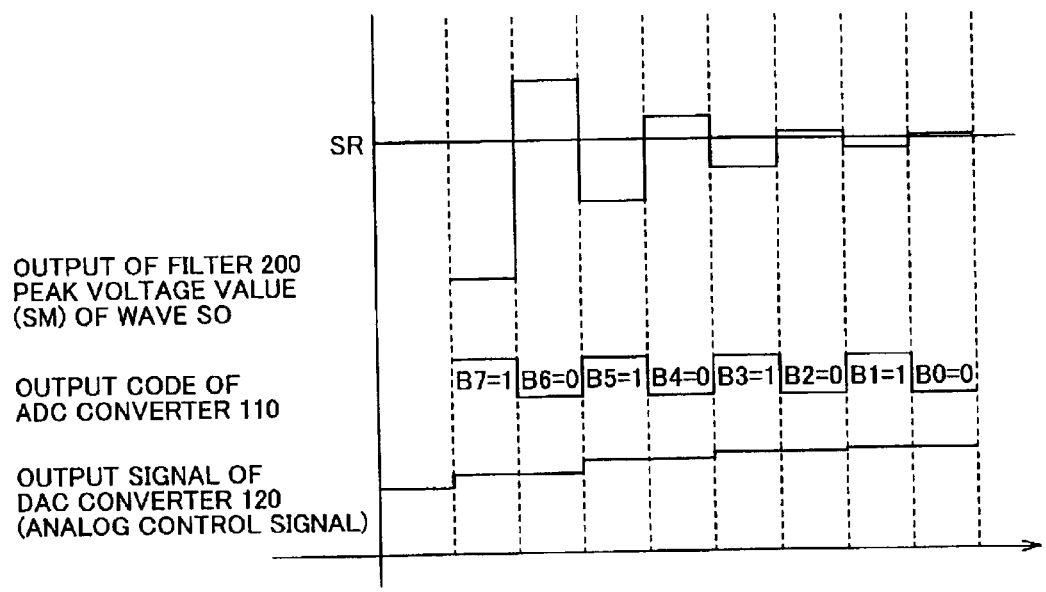
FIG. 5 is an operation waveform diagram of a gain control circuit 700 in Gm-C circuit 1000 of the first embodiment of the invention.

Referring to FIG. 5, ADC circuit 110 is of a high-order comparison type, and determines digital codes in the order from a most significant bit B7 to a least significant bit B0. For example, most significant bit B7 is first set to "1", and a comparison is made between a reference level, i.e., a level of sampling signal SR and a peak voltage level of sampling signal SM. Since the peak voltage level of sampling signal SR as the reference is higher than that of sampling signal SM, bit B7 is set to "1". Then, bit B6 is set to "1", and a comparison is made between the level of sampling signal SR as the reference and the peak voltage level of sampling signal SM. Since the peak voltage level of sampling signal SM is higher than that of sampling signal SR as the reference, bit B6 is set to "0". In a similar manner, bits B5–B0 are successively set so that a digital output code of the ADC converter is finally set to "10101010". As a result, gain control signal CS finally attains an analog control voltage level achieving such a relationship that a peak voltage value of intended signal SI# generated by removing interference waves from input signal SI of filter 200 is substantially equal to the peak voltage value of output signal SO passed through filter 200.

Owing to the above structures, it is possible to correct precisely the gain loss occurring in filter 200.

According to the first embodiment of the invention, which is already described by way of example, the Gm-C filter has the one input and the one output. However, the invention may be applied to structures other than the above. The invention may be applied to a Gm-C filter having two inputs and two outputs. This is true also with respect to embodiments, which will be described later.

Figure 6:
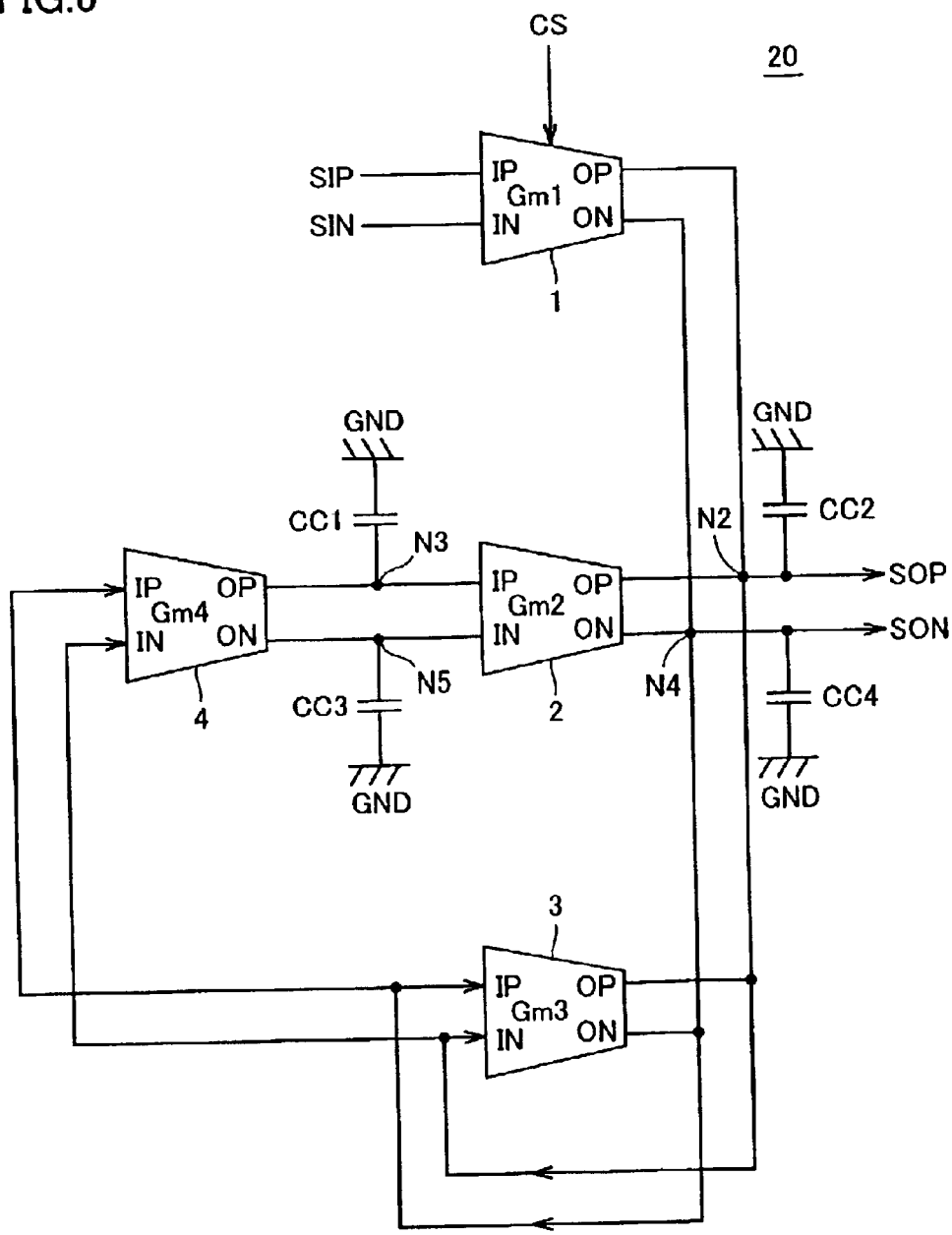
FIG. 6 shows a structure for applying gain control signal CS to OTA 1 in filter 200 forming a Gm-C filter 20 having two inputs and two outputs.

Referring to FIG. 6, OTAs 1–3 are arranged in parallel with each other, and output node N2 is connected to each of output nodes OP of OTAs 1–3. An output node N4 is connected to each of output nodes ON of OTAs 1–3. Referring to FIG. 15 again, output node ON of each OTA is a connection node between P- and N-channel MOS transistors PT2 and NT2 in the circuit structure of each OTA. A capacitor CC2 is connected between output node N2 and ground voltage GND. A signal applied to output node N2 will be output signal SOP of secondary band-pass Gm-C filter 20. A capacitor CC4 is connected between output node N4 and ground voltage GND. A signal applied to output node N4 will be an output signal SON of secondary band-pass filter 20.

OTA 1 receives signals SIP and SIN applied to secondary band-path Gm-C filter 20 on their input nodes IP and IN, and applies output signals to output nodes OP and ON electrically connected to output nodes N2 and N4, respectively. OTA 2 receives signals applied from nodes N3 and N5 on their input nodes IP and IN, and applies output signals to output nodes OP and ON electrically connected to output nodes N2 and N4, respectively. OTA 4 receives signals applied to nodes N4 and N2 on their input nodes IP and IN, and applies output signals to output nodes OP and ON electrically connected to output nodes N3 and N5, respectively. Capacitor CC3 is connected between ground voltage GND and node N5. OTA 3 receives signals applied to nodes N4 and N2 on their input nodes IP and IN, and applies output signals to output nodes OP and ON electrically connected to output nodes N2 and N4, respectively.

In the foregoing structure of Gm-C filter 20 having two inputs and two outputs, control signal CS can be applied to OTA 1 similarly to the foregoing manner so that the gain loss occurring in filter 200 can be precisely corrected.

(Modification of First Embodiment)

Figure 7:
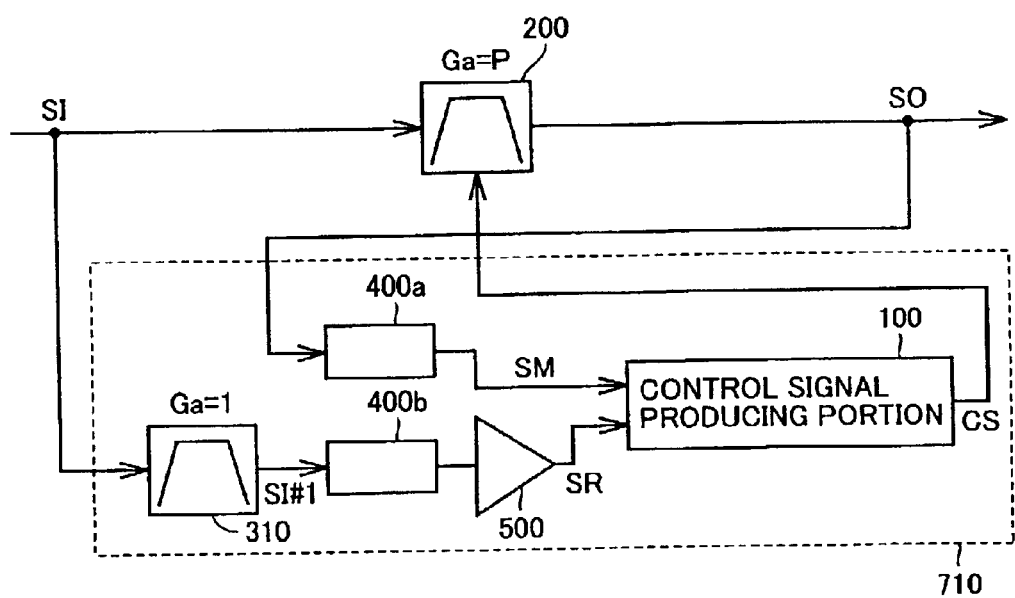
FIG. 7 shows circuit blocks of a Gm-C filter 2000.

Referring to FIG. 7, a Gm-C filter 2000 includes filter 200 having a gain Ga equal to P (Ga=P) and a gain control circuit 710.

Gain control circuit 710 includes a filer 310 having gain Ga equal to 1 (Ga=1), peak detectors 400a and 400b, an amplifier 500 and control signal producing portion 100.

Gain control circuit 710 differs from gain control circuit 700 in the first embodiment in that filter 300 having gain Ga equal to P is replaced with filter 310 having gain Ga equal to one (Ga=1) and amplifier 500 for amplifying an input by P times.

Thus, filter 310 has gain Ga equal to 1, rejects interference waves mixed in input signal SI, and passes a signal component of intended signal SI#1 with gain Ga equal to one (Ga=1).

Referring to FIG. 3 again, since the gain of filter 300 is determined by the resistance ratio of R3/R1, filter 310 can be achieved by designing the structure of filter 300 such that values of resistances R1 and R3 are equal to each other.

Peak detector 400b precisely samples the peak voltage value of intended signal SI#1 passed through filter 300 to produce sampling signal SR. Amplifier 500 amplifies sampling signal SR with gain Ga equal to P (Ga=P). Peak detector 400a precisely samples the peak voltage value of output signal SO passed through filter 200 to produce sampling signal SM.

Control signal producing portion 100 uses sampling signal SR amplified by amplifier 500 as a reference level, and produces gain control signal CS, which matches sampling signal SM with the reference level. By applying gain control signal CS to OTA 1 included in filter 200, conductance Gm1 changes, and filter 200 is corrected to have gain Ga equal to P (Ga=P).

Figure 8:
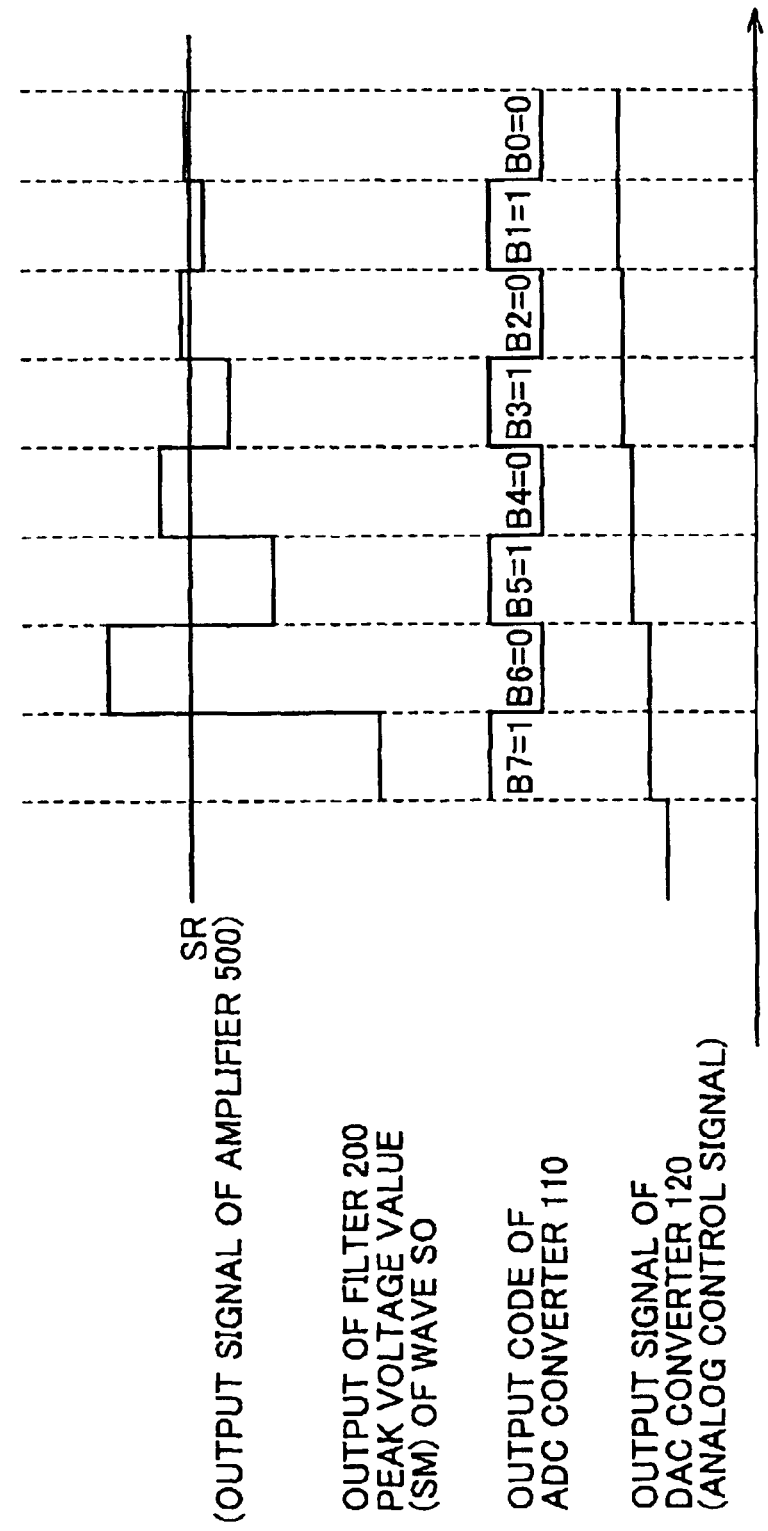
FIG. 8 shows operation waveforms of a gain control circuit 710 in Gm-C circuit 2000 of a modification of the first embodiment of the invention.

Referring to FIG. 8, sampling signal SR providing the reference level is an output signal of amplifier 500. In this point, sampling signal SR in FIG. 8 differs from sampling signal SR in FIG. 5.

In the same manner as that of the first embodiment already described with reference to FIG. 5, gain control signal CS in FIG. 8 is set such that sampling signal SR providing the reference level may match with sampling signal SM.

In the above structure, the gain loss occurring in filter 200 can be precisely corrected.

(Second Embodiment)

Figure 9:
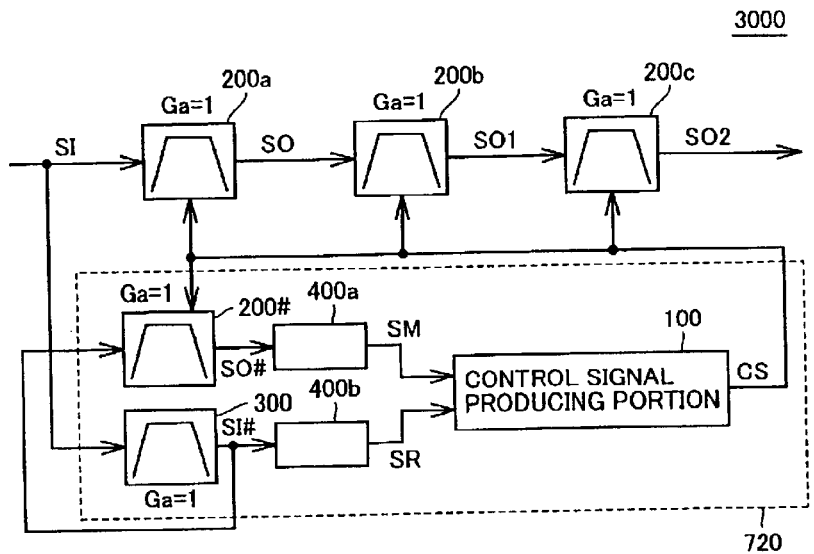
FIG. 9 shows circuit blocks of a Gm-C filter 3000 according to a second embodiment.

Referring to FIG. 9, a Gm-C filter 3000 includes a plurality of filters 200a–200c each having gain Ga equal to 1 and a gain control circuit 720. Each of filters 200a–200c is substantially the same as filter 200 already described in connection with the first embodiment, and therefore description thereof is not repeated.

Gain control circuit 720 includes a filter 200#, filter 300, peak detectors 400a and 400b, and control signal producing portion 100.

Gain control circuit 720 differs from gain control circuit 700 in the first embodiment in that filter 200#, which is a replica or a dummy of filter 200a, 200b or 200c, is additionally employed.

In contrast to the structure of the first embodiment using output signal SO passed through filter 200, gain control signal CS is produced based on a result of simulated amplification by replica filter 200#.

Input signal SI applied to the Gm-C filter according to the invention is input to three filters 200a–200c and filter 300. During an initial period for gain control, a gain loss occurs in each of output signals SO, SO1 and SO2 of filters 200a–200c. Filter 300 has gain Ga equal to one, rejects interference waves mixed in input signal SI, and passes a signal component of intended signal SI# with gain Ga equal to one (Ga=1). Intended signal SI# is input to peak detector 400b and filter 200#. Peak detector 400b precisely samples the peak voltage value of intended signal SI# passed through filter 300, and produces sampling signal SR.

Peak detector 400a precisely samples the peak voltage value of intended signal SO#, which passed through filter 200# with gain Ga equal to one, and produces sampling signal SM. Output signals of both peak detectors 400a and 400b are applied to control signal producing portion 100. Control signal producing portion 100 uses sampling signal SR of peak detector 400b as a reference level, and produces gain control signal CS, which matches sampling signal SM of peak detector 400a with the reference level. Gain control signal CS is applied to each of filters 200a–200c and replica filter 200#. By applying gain control signal CS to OTAs 1 included in filters 200a–200c and replica filter 200#, conductance Gm1 of each filter changes, and correction is made to provide gain Ga equal to 1 (Ga=1).

Figure 10:
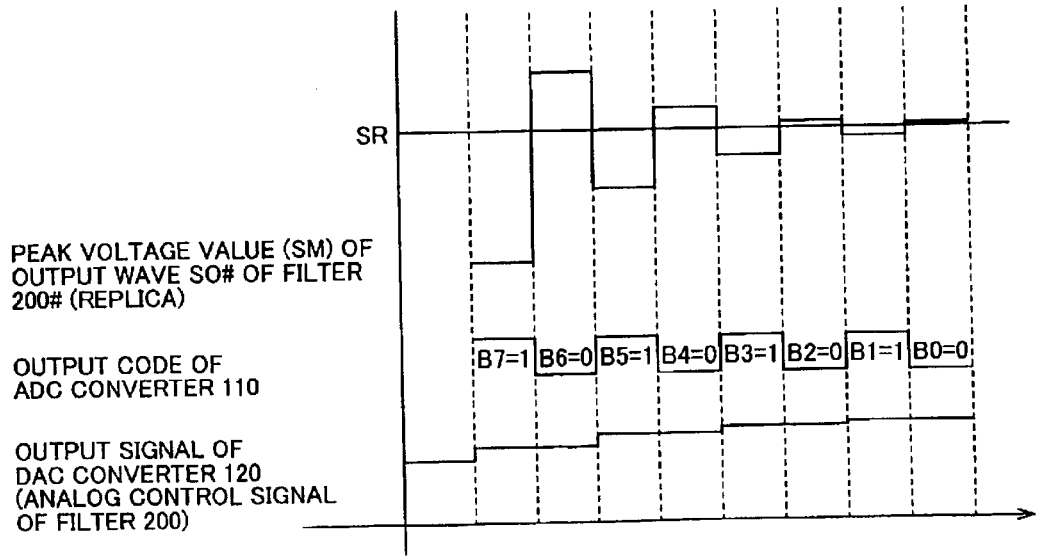
FIG. 10 shows operation waveforms of a gain control circuit 720 in Gm-C circuit 3000 of the second embodiment of the invention.

Referring to FIG. 10, sampling signal SM differs from sampling signal SM in FIG. 5 in that sampling signal SM in FIG. 10 is a peak voltage value of output signal SO# of replica filter 200#.

In FIG. 10, gain control signal CS is set in accordance with the same manner as that of the first embodiment shown in FIG. 5 so that sampling signal SR providing the reference matches with sampling signal SM.

In the above structure, gain losses occurring in filters 200a–200c can be precisely corrected.

In the structure employing three filters 200a–200c, the gain of whole the Gm-C filter formed of three filters 200a–200c can be controlled by controlling the gain of replica filter 200#. As a result, the gain control of whole the Gm-C filter can be easily controlled, and the time required for controlling the gain can be reduced. The number of filters is not restricted to three, and the invention may be applied to structures employing filters other than three in number.

(Third Embodiment)

Figure 11:
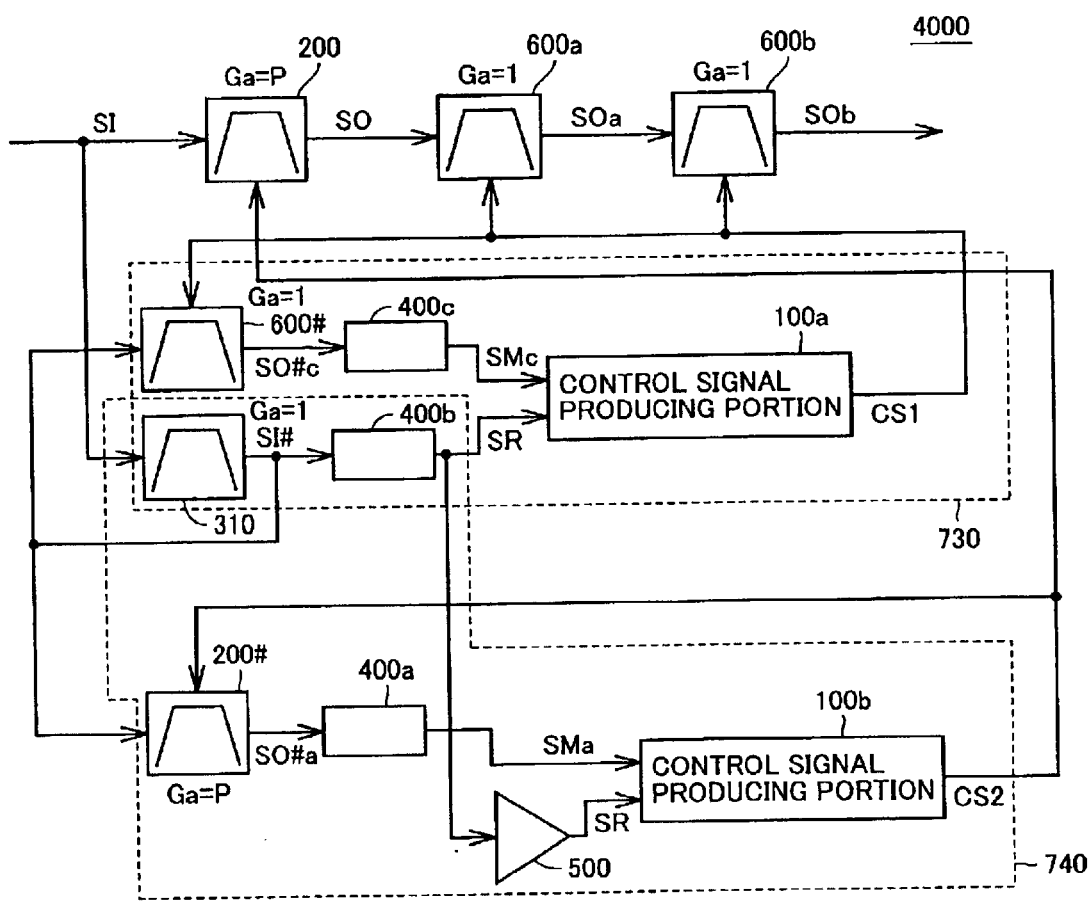
FIG. 11 shows circuit blocks in a Gm-C filter 4000 according to a third embodiment.

Referring to FIG. 11, a Gm-C filter 4000 includes a filter 200 having gain Ga equal to P (Ga=P), filters 600a and 600b, which will be generally referred to as "filters 600" hereinafter, and each have a gain equal to one, and gain control circuits 730 and 740. Each of filters 600a and 600b has a structure similar to that of secondary band-pass Gm-C filter 10 shown in FIG. 14, and has a gain Ga equal to one.

The third embodiment aims at controlling a gain of Gm-C filter 4000 provided with two kinds of filters 200 and 600 having gains Ga of different values.

Gain control circuit 730 includes a filter 600#, which is a replica of filter 600, filter 310 having gain Ga equal to one, peak detectors 400c and 400b, and a control signal producing portion 100a. Gain control circuit 740 includes filter 200#, which is a replica of filter 200, filter 310, peak detectors 400b and 400a, a control signal producing portion 100b and amplifier 500.

Gain control circuit 730 differs from gain control circuit 720 in that replica filter 600# is employed instead of replica filter 200#. Thus, gain control circuit 730 is used for filters 600.

Gain control circuit 740 differs from gain control circuit 720 in that filter 310 and amplifier 500 are employed instead of filter 300. Thus, gain control circuit 740 is used for filter 200.

Filter 310 can be commonly used by gain control circuits 730 and 740.

Input signal SI of Gm-C filter 4000 according to the invention is received by filter 200 and two filters 600. During an initial period for the gain control, a gain loss occurs in each of output signals (SO, SOa and SOb) of filters 200, 600a and 600b.

Filter 310 has gain Ga equal to one, rejects interference waves mixed in the input signal, and passes a signal component of intended signal SI# with gain Ga equal to one. Intended signal SI# is applied to peak detector 400b and replica filters 600# and 200#. Peak detector 400b precisely samples the peak voltage value of intended signal SI# passed through filter 310, and produces sampling signal SR.

Peak detectors 400c and 400a of gain control circuits 730 and 740 precisely sample the peak voltage values of intended signals SO#c and SO#a passed through replica filters 600# and 200#, and produce sampling signals SMc and SMa, respectively.

Control signal producing portion 100a uses sampling signal SR of peak detector 400b as a reference level, and produces a gain control signal CS1, which matches sampling signal SMc of peak detector 400c with the reference level. Gain control signal CS1 is input to filters 600a and 600b.

Control signal producing portion 100b uses sampling signal SR of peak detector 400b, which is amplified by P times via amplifier 500, as a reference level, and produces a gain control signal CS2, which matches sampling signal SMa of peak detector 400a with the reference level. Gain control signal CS2 is input to filter 200. By applying gain control signals CS1 and CS2 to OTAs 1 included in filters 600a and 600b, filter 200 and replica filters 200# and 600#, conductance Gm1 of each filter changes so that gain Ga is corrected. In filters 200 and 200#, gain Ga is corrected to P (Ga=P). In filters 600 and 600#, gain Ga is corrected to one (Ga=1).

Figure 12:
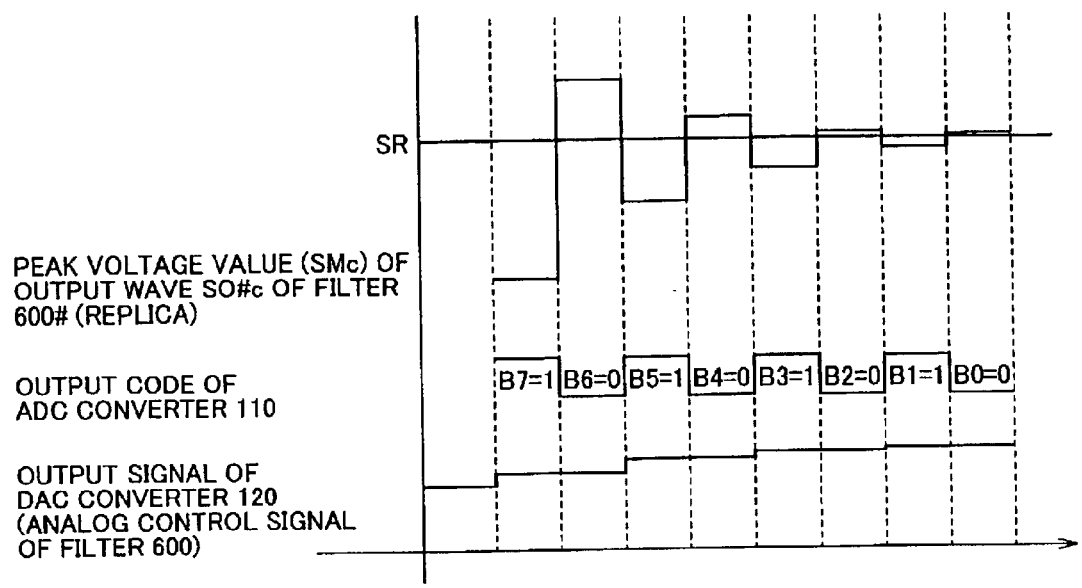
FIG. 12 shows operation waveforms of a gain control circuit 730 in the Gm-C circuit 4000 of the third embodiment of the invention.
Figure 13:
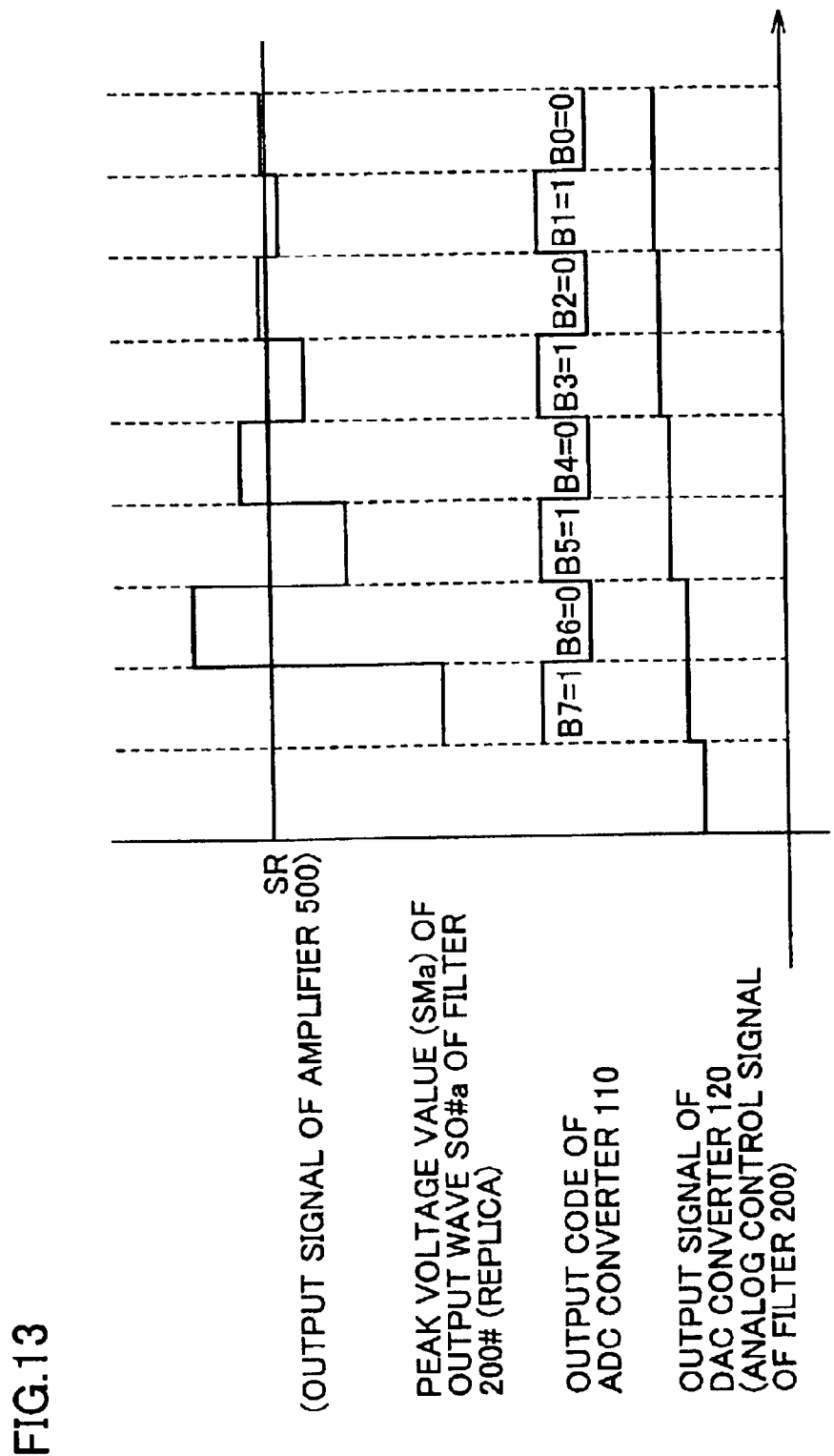
FIG. 13 shows operation waveforms of a gain control circuit 740 in Gm-C circuit 4000 of the third embodiment of the invention.

Referring to FIG. 12, sampling signal SMc differs from sampling signal SM shown in FIG. 5 in that sampling signal SMc is a peak voltage value of an output signal SO#c of replica filter 600#. Referring to FIG. 13, sampling signal SR is a signal amplified by amplifier 500, and sampling signal SMa is a peak voltage value of output signal SO#a of replica filter 200#. In these points, sampling signals SR and SMa in FIG. 13 are different from sampling signals SR and SM shown in FIG. 10.

In operations shown in FIGS. 12 and 13, gain control signal CS is set according to the manner already described and shown in FIG. 5 in connection with the first embodiment so that gain control signal CS is set so that sampling signal SR as the reference level may match with sampling signals SMa and SMc.

In the above structure, gain losses occurring in filters 200 and 600 can be precisely corrected.

In the structure employing two kinds of filters 200 and 600, the gain of whole the Gm-C filter can be controlled by controlling gains Ga of replica filters 200# and 600#. As a result, the gain of whole the Gm-C filter can be easily controlled, and the time required for controlling the gain can be reduced. The number of filter stages is not restricted to three, and the invention can likewise be applied to structure having any number of filter stages more than one. Filter 200 having gain Ga equal to P is employed in the first input stage of the plurality of filter stages connected in series. The structure is not restricted to this, and may be configured such that one arbitrary filter following the input stage has gain Ga equal to P, and other filters have gains Ga equal to one.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A continuous-time analog filter comprising:

a first filter for amplifying with a prescribed amplification gain signal having a frequency within a certain band in an input signal, and passing the amplified signal; and a gain control circuit configured for controlling the amplification gain in said first filter, wherein said gain control circuit includes:

a second filter for amplifying said input signal with said predetermined amplification gain, and rejecting interference waves contained in said input signal, detecting circuits configured for detecting maximum values of amplitudes of output signals of said first and second filters, and a determining circuit configured for receiving results of detection of said detecting circuits, and controlling the amplification gain of said first filter based on a comparison between the output signals of said first and second filters, wherein said first filter has an operational transconductance amplifier, and said gain control circuit controls a conductance value of said operational transconductance amplifier employed in said first filter.

2. The continuous-time analog filter according to claim 1, wherein said second filter includes a filter unit configured for performing amplification with an amplification gain of one, and rejecting the interference waves contained in said input signal, and an amplifier circuit configured for amplifying an output of said filter unit with said predetermined amplification gain.

3. A continuous-time filter comprising:

a first filter for amplifying with a prescribed amplification gain signal having a frequency within a certain band in an input signal, and passing the amplified signal; and a first gain control circuit configured for controlling the amplification gain in said first filter, said first gain control circuit including:

a second filter for amplifying said input signal with said predetermined amplification gain, and rejecting interference waves contained in said input signal, a first dummy filter having characteristics similar to those of said first filter, first detecting circuits configured for detecting maximum values of amplitudes of an output signal of said first dummy filter receiving an output signal of said second filter and an output signal of said second filter, and a first determining circuit configured for receiving results of detection of said first detecting circuits, and controlling the amplification gains of said first filter and said first dummy filter based on a comparison between the output signals of said second filter and said first dummy filter.

4. The continuous-time analog filter according to claim 3, further comprising:

a third filter connected in series to said first filter for amplifying with a prescribed amplification gain signal having the frequency within the certain band in the input signal and passing the amplified signal, and a second gain control circuit configured for controlling the amplification gain in said third filter, wherein said second gain control circuit includes:

a second dummy filter having characteristics similar to those of said third filter, second detecting circuits configured for detecting maximum values of amplitudes of an output signal of said second dummy filter receiving an output signal of said second filter and an output signal of said second filter, and a second determining circuit configured for receiving results of detection of said second detecting circuits, and controlling the amplification gains of said third filter and said second dummy filter based on a comparison between the output signals of said second filter and said second dummy filter.

* * * * *